United States Patent
Kashiwagi

(10) Patent No.: US 6,867,975 B2
(45) Date of Patent: Mar. 15, 2005

(54) HEAT SINK, FIXING METHOD THEREOF AND ELECTRONIC APPARATUS USING HEAT SINK

(75) Inventor: Toshiyuki Kashiwagi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 43 days.

(21) Appl. No.: 10/351,419

(22) Filed: Jan. 27, 2003

(65) Prior Publication Data

US 2004/0027807 A1 Feb. 12, 2004

(30) Foreign Application Priority Data

Aug. 6, 2002 (JP) .................................... 2002-229311

(51) Int. Cl.⁷ ............................................... H05K 7/20
(52) U.S. Cl. .................. 361/704; 165/80.3; 165/185; 257/719; 361/719
(58) Field of Search ........................... 165/80.2, 80.3, 165/185; 257/706–707, 712–713, 718–719, 726–727; 361/687–721

(56) References Cited

U.S. PATENT DOCUMENTS

| | | | | |
|---|---|---|---|---|
| 4,933,746 A | * | 6/1990 | King | 257/718 |
| 6,101,091 A | * | 8/2000 | Baik | 361/704 |
| 6,243,265 B1 | * | 6/2001 | Wong et al. | 361/704 |
| 6,327,148 B1 | * | 12/2001 | Tucker et al. | 361/704 |
| 6,392,888 B1 | * | 5/2002 | Chen et al. | 361/704 |
| 6,606,246 B2 | * | 8/2003 | Wells | 361/719 |

FOREIGN PATENT DOCUMENTS

| | | |
|---|---|---|
| JP | 2000-22089 | 1/2000 |
| JP | 2000-124650 | 4/2000 |

* cited by examiner

*Primary Examiner*—Gregory D Thompson
(74) *Attorney, Agent, or Firm*—Staas & Halsey LLP

(57) ABSTRACT

Heat sink has fins on the top surface thereof and pin portions on the bottom surface thereof. Rivets having longitudinal through-hole are inserted into holes in a retention module. When the heat sink and the retention module are simultaneously pressed downward, the rivets are inserted into the corresponding holes formed in a base board. The pin portions are inserted into the through-holes of the rivets so that the retention module is locked onto the base board and the heat sink is fixed and the bottom surface of the heat sink is contacted with an integrated circuit element, at the same time.

9 Claims, 3 Drawing Sheets

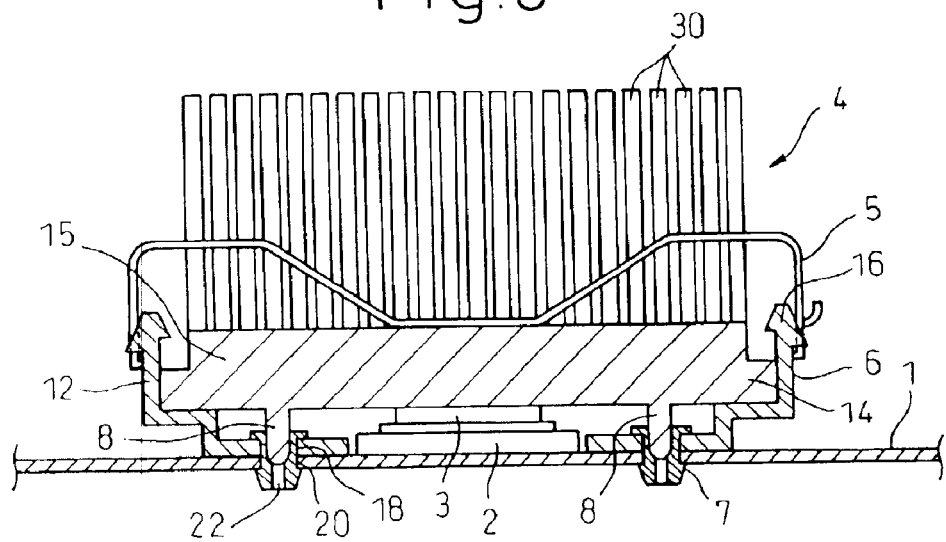
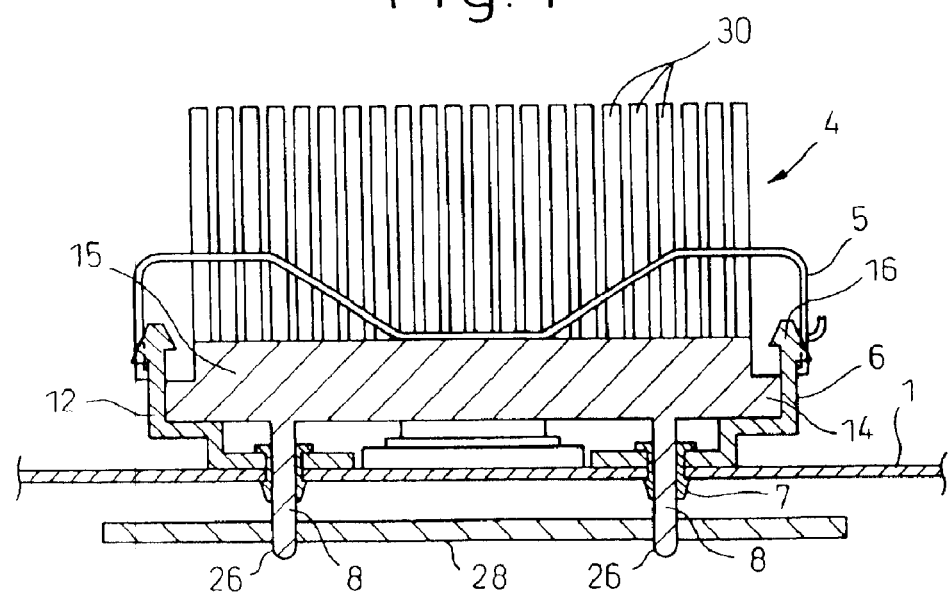

HEAT SINK, FIXING METHOD THEREOF AND ELECTRONIC APPARATUS USING HEAT SINK

BACKGROUND OF THE INVENTION

1. Field of the Invention

The present invention relates to a heat sink for cooling an integrated circuit element such as a central processing unit (CPU), a video chip, and so forth, incorporated into an electronic apparatus such as a computer, and so forth. The present invention also relates to a method of attaching the heat sink and an electronic apparatus in which the heat sink is incorporated.

2. Description of the Prior Art

As the electric power consumption of a CPU, which is incorporated in an electronic apparatus such as a computer, is great, the CPU is conventionally cooled with a heat sink or a heat sink combined with a cooling fan.

Recently, it has been tried, on one hand, to decrease the electric power consumption of the CPU, by miniaturization of the CPU in the manufacturing process and on the other hand, the electric power consumption of the CPU has increased due to the increase in the degree of integration of the CPU and valve of the driving frequency of the CPU. That is, there are two contrary factors, so there is a demand for a cooling means, for cooling the circuit elements, the cooling capacity of which is greater than that of the conventional cooling means. Accordingly, although the size of a core and a package of the CPU can be reduced by miniaturization in the manufacturing process even if the degree of integration is increased, a quantity of generated heat is still great. Therefore, it is impossible to use a heat sink, the size of which is smaller than the size of the conventional heat sink.

Accordingly, the size of the heat sink is necessarily larger than the size of the package such as the CPU. With such a heat sink, a conventional fixing means of the type in which the heat sink is fixed by engaging metallic springs with pawls arranged around a socket is used, but it is difficult to fix the heat sink by this fixing means and it is impossible to fix the heat sink in a stable state. Therefore, a cooling means having a retention module has recently been adopted for fixing the heat sink at a predetermined position on a base board such as a mother board. FIG. 5 is a view showing an example of the cooling means having the retention module.

Referring to FIG. 5, detailed explanations will be made with respect to a cooling means having a conventional retention module for cooling a central processing unit (CPU). In FIG. 5, reference numeral 1 is a base board, reference numeral 2 is a CPU socket, reference numeral 3 is a CPU, reference numeral 4 is a heat sink, reference numeral 5 is a clip made of metal, reference numeral 6 is a retention module, reference numeral 7 is a rivet, and reference numeral 9 is a pin.

The retention module 6 is composed as follows. The retention module 6 is formed in a box shape with an open top side, an opening 10 at the center of the bottom portion, the size of which is larger than an external form of the CPU socket 2, and a circumferential wall 12 into which a bottom portion 14 of the heat sink 4 can be received. In this example shown here, the retention module 6 has an engaging section 16 with an inwardly protruding portion so that the engaging section 16 can receive the bottom section 14 of the heat sink 4 when the engaging section 16 is deformed outward. Further, at the bottom section of the retention module 6, there are provided a plurality of holes 18 by which the retention module 6 can be attached to the base board 1. In this case, it is preferable that four holes 18 are formed.

The heat sink 4 is attached to the base board 1 with this retention module 6 by the following method. First of all, the CPU 3 is attached to the CPU socket 2. Then, the CPU socket 2 and the CPU 3 are protruded from the opening 10 of the bottom section of the retention module 6. The retention module 6 is put on the base board 1 so that a plurality of holes 18 of the retention module 6 can align with a plurality of corresponding holes 20 formed in the base board. Rivets 7 having longitudinal through-holes 22 in are inserted into the holes 18 of the retention module and the openings 20 of the base board 1, so that the retention module 6 is temporarily attached to the base board 1. After that, pins 9, the outer diameters of which are a little larger than the inner diameters of the through-holes 22, are press-fitted into the longitudinal through-holes 22 of the rivets 7. Due to the foregoing, the outer diameter of each rivet 7 is expanded by press-fitting, so that the retention module 6 can be locked and fixed onto the base board 1.

After that, when the heat sink 4 is inserted into the retention module 6 while the bottom section 14 of the heat sink 4 is being kept downward, the engaging sections 16 of the retention module 6 are expanded outward. When the upper surface of the bottom section 14 of the heat sink 4 comes to a position lower than the lower end of the engaging sections 16, the engaging sections 16 return to the initial position, and the upper surface of the bottom section 14 of the heat sink 4 can be engaged so that the heat sink 4 cannot come out. Next, a pair of clips 5 made of metal, as shown in the drawing, both end portions of which are bent into an L-shape are engaged with engaging sections (not shown) of the retention module 6 in such a manner that the L-shaped portions of the clips are engaged with the engaging section. (In FIG. 5, only one clip 5 made of metal is shown in the drawing, and the L-shaped portions at both end portions of the clip are not shown in the drawing.) Therefore, the heat sink 4 is given a pressing force, the direction of which is downward, generated by an elastic force of the clip. Accordingly, the bottom surface 24 of the heat sink 4 is made to come into contact with the upper portion of the CPU 3. In this way, heat conduction between the heat sink 4 and the CPU 3 can be improved.

In the cooling means in which the above retention module 6 is used, the circumference of the heat sink 4 is fixed to the retention module 6, and the retention module 6 is fixed onto the base board 1, and therefore, the heat sink 4 can be immovablly and stably attached onto the base board 1. In this connection, although not shown in the drawing, when necessary, a well known cooling fan is arranged at an upper end portion of the heat sink 4 so as to improve the cooling efficiency of the heat sink 4.

However, in the above fixing structure of the conventional retention module 6 and the heat sink 4, the following problems may be encountered. After the plurality of pins 9 have been separately press-fitted into the longitudinal through-holes 22 of the rivets 7, the heat sink 4 is attached to the retention module 6. Therefore, a process in which the retention module 6 is attached and a process in which the heat sink 4 is attached must be separately provided, which causes an increase in the amount of work. In addition to that, as the heat sink 4 is fixed to the retention module 6 only by the pair of clips 5, a pressing force of the heat sink 4 to the CPU 3 is so weak that the attaching strength of the heat sink 4 is low, which deteriorates the reliability of preventing the heat sink from coming out. Further, it is impossible for the heat sink 4 to be uniformly pressed to the CPU 3.

The present inventors made various experiments to solve the above problems. As a result, they found the following. When the heat sink is made to have a function of the above pins, it is possible to solve the problems of the prior art in which a large amount of work is required and the attaching strength is low so that the reliability is deteriorated and it is impossible to push the heat sink uniformly.

SUMMARY OF THE INVENTION

An object of the present invention is to provide a heat sink by which the heat sink and a retention module can be simultaneously attached and fixed, so that the number of mandays of working can be decreased, and the mechanical strength of attaching the heat sink can be increased so that the reliability can be enhanced. Another object of the present invention is to provide a new method of attaching the above heat sink. The above objects of the present invention can be accomplished by the following constitution.

According to the first aspect of the present invention, there is provided a heat sink comprising a heat sink body and a plurality of pin portions which comprise elongated projections on the bottom surface of the heat sink body. According to this feature, a retention module and the heat sink can be fixed and the bottom surface of the heat sink can be contacted with an integrated circuit element, at the same time, without using separately provided pins which are used in the conventional example.

Preferably, the plurality of pin portions are formed integrally with the heat sink body. It is preferable that the plurality of pin portions are formed by means of cutting the heat sink body. Due to this structure, the mechanical strength between the pin portions and the heat sink body can be enhanced, and heat resistance between the pin portions and the heat sink body can be reduced. Especially when the pin portions are formed by means of cutting, fins of the heat sink body are usually formed by means of cutting, and the pin portions are also formed by means of cutting at the same time, so the forming process of the pin portions can be simplified.

Preferably, the plurality of pin portions are formed by attaching the pin portions to the heat sink body by means of screwing. Alternatively, it is preferable that the plurality of pin portions are formed by attaching the pin portions to the heat sink body by means of welding or press-fitting. Due to the above structure, it is possible to attach the plurality of pin portions to the heat sink body easily. Further, it is possible to provide a heat sink, the mechanical strength of attaching the pin portions to the heat sink body of which can be enhanced. In this connection, the profile of each pin portion can be formed into a circular cylindrical shape, a rectangular or square prism shape or a polygonal prism shape, the number of corners of which is larger then four.

According to the second aspect of the present invention, there is provided a method of fixing a heat sink comprising the steps of: using a heat sink comprising a heat sink body and a plurality of pin portions comprising a elongated projections on the bottom surface of the heat sink body; inserting rivets having longitudinal through-hole into holes formed in a retention module; inserting the rivets into corresponding holes in a base board by simultaneously pushing the heat sink and retention module downward; and press-fitting the plurality of pin portions into the corresponding through-holes of the rivets, whereby fixation of the retention module and the heat sink to the base board and making contact of the bottom surface of the heat sink with an integrated circuit element simultaneously. According to this embodiment, the heat sink and the retention module can be simultaneously attached and fixed to the base board. Therefore, it is possible to reduce the amount of work. It is also possible to uniformly give a pressing force to the integrated circuit element. Further, when the heat sink is only drawn upward, it can be detached, which improves the working efficiency in the case of recycling.

Preferably, a clip made of metal is attached to the retention module and the heat sink is pressed to the integrated circuit element by an elastic force generated by the clip. According to this method, it becomes possible to increase intensity of the pressing force to press the heat sink to the integrated circuit element. Therefore, the mechanical strength of attaching the heat sink can be increased, which enhances the reliability of prevention of the heat sink from coming out.

Preferably, the plurality of pin portions of the heat sink are protruded from the end portions of the plurality of rivets and another heat sink is attached to the plurality of pin portions thus protruding. According to this method, as another heat sink is attached to the plurality of pin portions thus protruding, heat generated by the integrated circuit element can be radiated from another heat sink via the plurality of pin portions. Therefore, the cooling efficiency of cooling the integrated circuit element can be enhanced.

Another heat sink described above may be a member, the heat conductivity of which is high, provided in a portion of a casing accommodating the base board. Due to the above structure, even if a small casing is used, the integrated circuit element can be effectively cooled.

According to the third aspect of the present invention, there is provided an electronic apparatus comprising:

(a) a base board;

(b) an integrated circuit element attached to the base board;

(c) a heat sink for cooling the integrated circuit element;

(d) a retention module for fixing the heat sink at a predetermined position; and (e) a plurality of rivets commonly inserted into a plurality of holes respectively formed in the retention module and the base board so as to fix the retention module to the base board, each rivet having a through-hole formed in the inserting direction, wherein the heat sink comprises a heat sink body and a plurality of pin portions comprising elongated projections on the bottom surface of the heat sink body, and the plurality of pin portions are press-fitted into corresponding longitudinal through-holes formed in the rivets, so that the retention module and the heat sink can be fixed to the base board and the bottom surface of the heat sink can be made to come into contact with an integrated circuit element simultaneously. According to this feature, when the electronic apparatus is manufactured, the heat sink and the retention module can be simultaneously attached and fixed. Therefore, the amount of work can be reduced and further a pushing force can be uniformly given to the integrated circuit element. Further, when the heat sink is only drawn upward, it can be detached, which improves the working efficiency in the case of recycling.

Preferably, the retention module further includes a clip made of metal and the heat sink is further pressed to the integrated circuit element by an elastic force generated by the clip. According to this method, it becomes possible to increase intensity of the pressing force to press the heat sink to the integrated circuit element. Therefore, the mechanical strength of attaching the heat sink can be increased, which enhances the reliability of prevention of the heat sink from coming out.

Preferably, a cooling fan is attached to the heat sink. According to this constitution, the cooling efficiency of the heat sink with respect to the integrated circuit element can be enhanced by the cooling fan. Therefore, it is possible to reduce the size of the heat sink. Further, even if the size of the heat sink is kept constant, it is possible to use an integrated circuit element of high processing speed and high performance. That is, it is possible to provide a small electronic device of high performance.

Preferably, the plurality of pin portions of the heat sink are protruded from the end portions of the plurality of rivets and another heat sink is attached to the plurality of protruding pin portions. According to this constitution, as another heat sink is attached to the plurality of protruding pin portions, heat generated by the integrated circuit element can be radiated from another heat sink described above via the plurality of pin portions. Therefore, the cooling efficiency of cooling the integrated circuit element can be enhanced. Accordingly, it becomes possible to use an integrated circuit element of high processing speed and high performance. As a result, it is possible to obtain an electronic device of high performance.

Another heat sink described above may be a member of high heat conductivity provided in a portion of the casing in which the base board is accommodated. According to the above constitution, even if a small casing is used, the integrated circuit element can be effectively cooled. Therefore, it is possible to use an integrated circuit element of high processing speed and high performance. Accordingly, it becomes possible to obtain a small electronic device of high performance.

BRIEF DESCRIPTION OF THE DRAWINGS

The present invention will become more apparent from the following description of the preferred embodiments, with reference to the accompanying drawings, in which:

FIG. 3 is a schematic view of the electronic apparatus of FIG. 2 in the state after the heat sink is attached;

FIG. 4 is a schematic view illustrating an electronic apparatus according another embodiment of the present invention.

DESCRIPTION OF THE PREFERRED EMBODIMENTS

Figure 5:
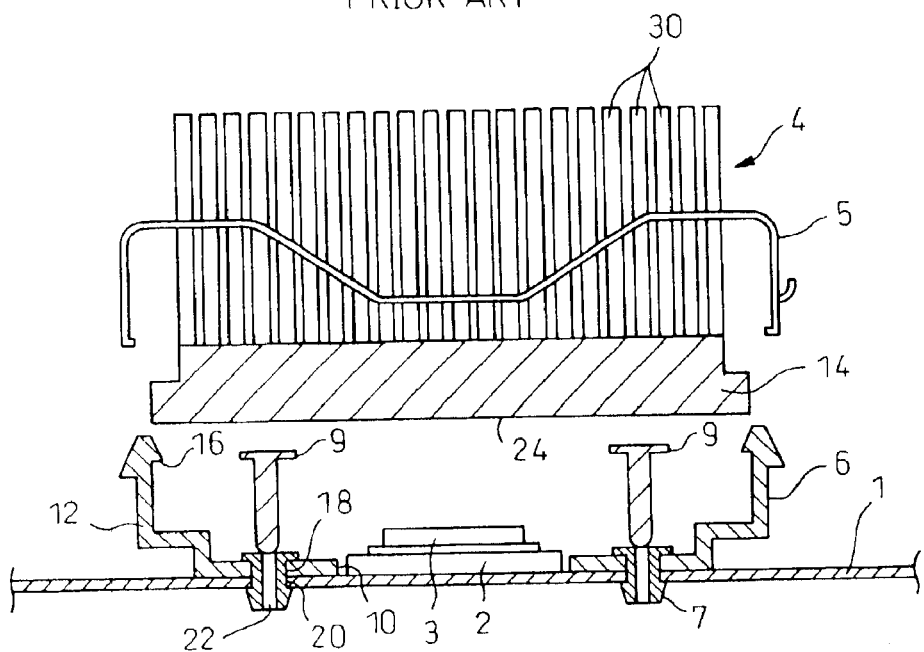
FIG. 5 is a schematic view illustrating the prior art.

By referring to the drawings, embodiments of the present invention will be explained below in detail. The following explanation is made on a case in which CPU is used as an integrated circuit element, but the present invention can be applied to not only a CPU but also an integrated circuit element, such as a video chip, which generates a large quantity of heat. In the same manner, an explanation will be made in the case in which a cooling fan is not attached to the heat sink, but the present invention can be applied to a case in which a well known cooling fan is attached to the heat sink. In order to facilitate the understanding, like reference characters are used to indicate like parts in the drawings showing the embodiments those of the conventional example of FIG. 5.

EMBODIMENT 1

Figure 1:
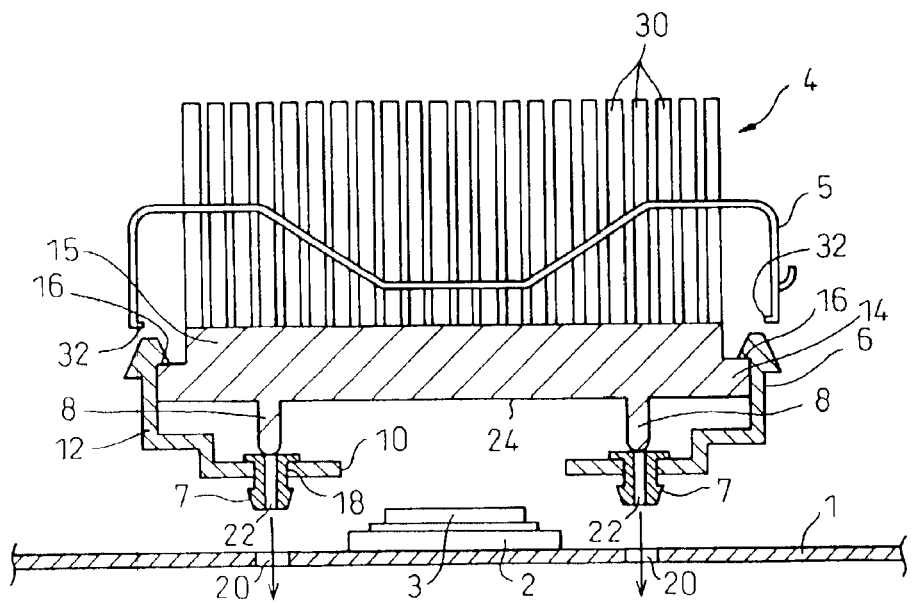
FIG. 1 is a schematic view illustrating an electronic apparatus according to one embodiment of the present invention in the state before a heat sink is attached.
Figure 2:
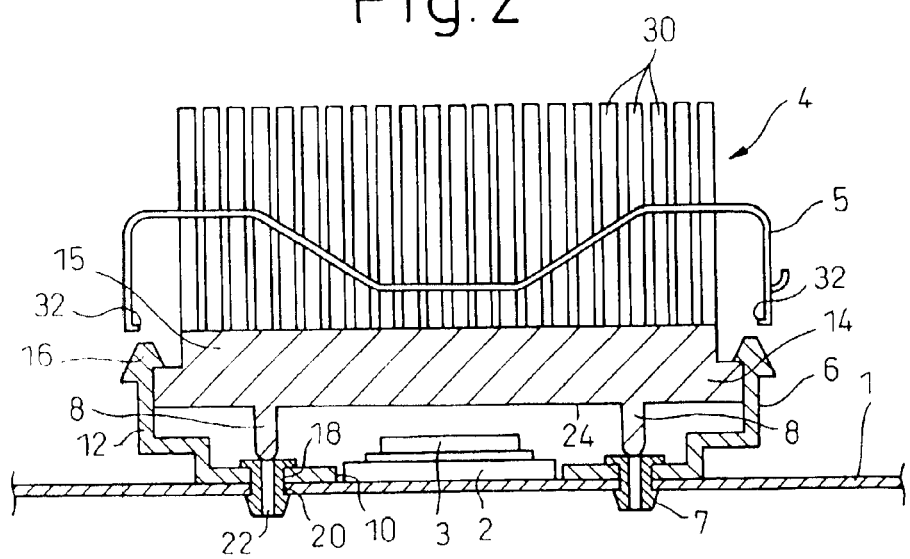
FIG. 2 is a schematic view of the electronic apparatus of FIG. 1 in the state where the heat sink is being attached.

FIGS. 1 to 3 are views illustrating an electronic apparatus according to the first embodiment of the present invention, in which FIG. 1 is a view showing the state immediately before the heat sink 4 and a retention module 6 are mounted on a base board (substrate) 1. On the CPU socket 2 arranged on the base board 1, a CPU 3 to be cooled by the heat sink 4 is mounted.

The heat sink 4 of the present invention includes a plate-like heat sink body 15 comprising a bottom portion 14 and a top portion 15 with a step therebetween. The heat sink 4 has a plurality of fins 30 on the top portion 15, and a plurality of pin portions 8 composed of elongated projections arranged on the bottom surface 24 of the heat sink body 15. The pin portions 8 may be formed integrally with the heat sink body 15 by means of cutting or casting. Alternatively, the pin portions 8 may be screwed into screw holes formed in the bottom surface 24 of the heat sink body 15, or the pins 8 may be press-fitted into holes formed in the bottom surface 24, or the pin portions 8 may be welded to the bottom surface 24.

Concerning the shape of each pin 8, the pin 8 may be formed in a circular cylindrical shape, a rectangular square prism shape or polygonal prism shape, the number of corners of which is larger than four. The heat sink body 15 including the fins 30 is usually made by means of cutting, and especially in the case where each pin portion 8 is formed in a rectangular or square prism shape, the pin portion 8 can be easily formed by means of cutting simultaneously when the heat sink body 15 is formed by means of cutting.

Therefore, the machining work can be easily performed.

In the case of attaching the heat sink 4 to a retention module 6, rivets 7 having longitudinal through-holes are first inserted into a plurality of holes 18 provided in the bottom portion of the retention module 6. The heat sink 4 is then inserted into the retention module 6, with the bottom portion 14 of the heat sink 4 directed downward, and the engaging sections 16 of the retention module 6 are expanded outward. When the upper surface of the bottom portion 14 of the heat sink 4 comes to a position lower than the lower edge of the engaging section 16, the engaging section 16 returns to the initial state. Accordingly, the upper surface of the bottom portion 14 of the heat sink 4 is engaged with the engaging section 16 so that it cannot come out. In this way, the heat sink 4 and the retention module 6 are integrated into one unit. FIG. 1 is a view showing this state.

Further, a plurality of rivets 7, which are attached to the retention module 6, are arranged so that they can be located at positions above the corresponding holes 20 formed in the base board 1. Both the heat sink 4 and the retention module 6 are lightly pushed at the same time, and the plurality of rivets 7 are inserted into the corresponding holes 20 in the base board 1. In this way, the retention module 6 is temporarily fixed onto the base board 1. FIG. 2 is a view showing thin state.

Next, the heat sink 4 is strongly pushed downward, and the plurality of pin portions 8 of the heat sink 4 are press-fitted into the longitudinal through-holes 22 in the rivets 7, until the bottom surface 24 of the heat sink 4 comes into contact with the surface of CPU 3. As shown in FIG. 3, since the diameter of each pin portion 8 of the heat sink 4 is a little larger than the inner diameter of the longitudinal through-hole 22 in each rivet 7, the outer diameter of each rivet 7 is a little expanded. Therefore, the retention module 6 and the heat sink 4 are simultaneously locked and fixed on the base board 1.

Even in the above state, a pressing force can be given between the heat sink 4 and CPU 3, however, in this embodiment, a pair of metal clips 5 (only one shown in FIGS. 1 to 3), both end portions 32 of which are bent into an L-shape, are engaged with engaging sections (not shown) of the retention module 6. FIG. 3 is a view showing this state. Due to the foregoing, a pressing force is given downward to the heat sink 4 by the elastic force generated by the pair of clips 5, and accordingly, the attaching strength of the heat sink 4 is increased. Therefore, the heat sink 4 can be prevented from coming out, and the reliability can be enhanced.

When the above heat sink 4 is detached, the plurality of clips 5 are first removed. Next, the heat sink 4 is drawn upward by a force stronger than the force given when the heat sink 4 was attached. In this way, the heat sink 4 can be easily detached. Therefore, the working property of recycling the heat sink is excellent.

EMBODIMENT 2

FIG. 4 is a view illustrating the second embodiment of the present invention. In this embodiment, pin portions 8 provided in the heat sink 4 are longer than those used in the first embodiment. Except for that, the structure of the second embodiment is the same as that of the first embodiment. In the same manner as that of the first embodiment, the pin portions 8 of the heat sink 4 are press-fitted into the longitudinal through-holes 22, which are formed in the plurality of rivets 7, until the bottom surface 24 of the heat sink 4 comes into contact with the surface of CPU 3. As shown in FIG. 4, as the diameter of each pin portion 8 of the heat sink 4 is a little larger than the inner diameter of the longitudinal through-hole 22 in each rivet 7, the outer diameter of each rivet 7 is a little expanded. Therefore, the retention module 6 and the heat sink 4 are simultaneously locked and fixed on the base board 1. At the same time, the forward end portions of the pin portions 8 are protruded from the forward end portions of the rivets 7.

Then, another heat sink 28 is fixed to the protruding portions 26 of the pin portions 8 from the lower side in the drawing by means of screwing, welding or press-fitting. Due to the above structure, heat generated from CPU 3 is radiated from not only the heat sink body 15 but also another heat sink 28 in such a manner that the heat is conducted to another heat sink 28 via the heat sink body 15 and the pin portions 8. Since heat is also radiated from another heat sink 28, the cooling efficiency of cooling the integrated circuit element 3 can be enhanced.

In this connection, concerning another heat sink 28, a flat plate type heat sink is used here. However, if there is provided a sufficiently large space in the lower portion of the base board 1, a heat sink having a large number of fins may be adopted. Further, such a structure may be adopted that a portion of the casing of the electronic device, for accommodating the base board 1, is composed of members made of material such as aluminum or magnesium, the heat radiating property of which is high, and the protruding portions 26 of the pin portions 8 are fixed to the members, the heat radiating property of which is high. When the latter structure is adopted, even if the casing is small, the cooling efficiency of cooling the integrated circuit element can be enhanced. Therefore, it becomes possible to use an integrated circuit element, the processing speed of which is high although a large quantity of heat is generated from the integrated circuit element. Accordingly, performance of the electronic device can be enhanced.

As described above, the heat sink of the present invention can be attached simultaneously when the retention module is attached. Therefore, the amount work can be reduced. Further, in the case of recycling the heat sink, the working property is excellent. Furthermore, it is possible to reduce the expense of purchasing and managing the pins which are necessary in the case of a conventional heat sink.

When the method of attaching a heat sink of the present invention is adopted, the following effects can be provided. In the conventional example, the heat sink is fixed by only one means of holding the heat sink with a clip, but on the other hand, in the present invention, the heat sink is fixed by not only the clip but also the rivets, that is, the heat sink is fixed by two means. Therefore, the mechanical strength of attaching the heat sink can be increased and further the reliability of preventing the heat sink from coming out can be enhanced and furthermore the heat sink can be pressed to the integrated circuit element with uniform urging pressure.

In addition to that, another heat sink can be attached to the pin portions of the heat sink. Accordingly, the effect of cooling the integrated circuit element can be enhanced. Therefore, even in an electronic apparatus, the casing of which is small, it is possible to use an integrated circuit element, the processing speed of which is high. As a result, it is possible to enhance the performance of the electronic device.

I claim:

1. A method of fixing a heat sink comprising a heat sink body and a plurality of pin portions comprising elongated projections on the bottom surface of the heat sink body, the method comprising:

inserting rivets having longitudinal through-holes into holes formed in a retention module;

inserting the rivets into corresponding holes in a base board by simultaneously pushing the heat sink and the retention module downward; and press-fitting the plurality of pins into the corresponding through-holes of the rivets, whereby fixation of the retention module and the heat sink to the base board and making contact between the bottom surface of the heat sink and an integrated circuit element are carried out simultaneously.

2. The method of fixing a heat sink according to claim 1, further comprising:

attaching a clip made of metal to the retention module so as to further press the heat sink to the integrated circuit element by an elastic force generated by the clip.

3. The method of fixing a heat sink according to claim 1, wherein the plurality of pin portions of the heat sink are protruded from end portions of the plurality of rivets, and another heat sink is attached to the plurality of protruding pin portions.

4. The method of fixing a heat sink according to claim 3, wherein said another heat sink is a member, the heat conductivity of which is high, arranged in one portion of a casing accommodating the base board.

5. An electronic apparatus, comprising:

a base board;

an integrated circuit element attached to the base board;

a heat sink for cooling the integrated circuit element;

a retention module for fixing the heat sink at a predetermined position; and a plurality of rivets commonly inserted into a plurality of holes respectively formed in the retention module and base board so as to fix the retention module to the base board, each rivet having a through-hole formed in the inserting direction, wherein the heat sink includes a heat sink body and a plurality of pin portions comprising elongated projections on the bottom face of the heat sink body, and the plurality of pins are press-fitted into the corresponding longitudinal through-holes formed in the rivets, so that the retention module and heat sink can be fixed to the base board and the bottom surface of the heat sink can be made to come into contact with the integrated circuit element simultaneously.

6. The electronic apparatus according to claim 5, wherein the retention module further includes a clip made of metal, and the heat sink is further pressed to the integrated circuit element by an elastic force of the clip.

7. The electronic apparatus according to claim 5, wherein a cooling fan is attached to the heat sink.

8. The electronic apparatus according to claim 5, wherein the plurality of pin portions of the heat sink are protruded from end portions of the plurality of rivets, and another heat sink is attached to the plurality of protruding pin portions.

9. The electronic apparatus according to claim 8, wherein another said heat sink is a member, the heat conductivity of which is high, arranged in one portion of a casing which accommodates the base board.

* * * * *